United States Patent
Chua et al.

(10) Patent No.: US 11,201,275 B1
(45) Date of Patent: Dec. 14, 2021

(54) SUPERCONDUCTING STRESS-ENGINEERED MICRO-FABRICATED SPRINGS

(71) Applicant: PALO ALTO RESEARCH CENTER INCORPORATED, Palo Alto, CA (US)

(72) Inventors: Christopher L. Chua, San Jose, CA (US); Eugene M. Chow, Fremont, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 16/897,667

(22) Filed: Jun. 10, 2020

(51) Int. Cl.
| | |
|---|---|
| *H01L 39/08* | (2006.01) |
| *H01R 13/24* | (2006.01) |
| *H01R 13/03* | (2006.01) |
| *H01L 39/24* | (2006.01) |

(52) U.S. Cl.
CPC .............. *H01L 39/08* (2013.01); *H01L 39/24* (2013.01); *H01R 13/03* (2013.01); *H01R 13/2407* (2013.01)

(58) Field of Classification Search
CPC ......... H01L 39/08; H01L 39/24; H01R 13/03; H01R 13/2407
See application file for complete search history.

(56) References Cited

U.S. PATENT DOCUMENTS

| | | | | |
|---|---|---|---|---|
| 2003/0059526 | A1* | 3/2003 | Benson | H01M 10/052 427/121 |
| 2016/0027556 | A1* | 1/2016 | Okuno | H01L 39/24 505/237 |
| 2016/0351310 | A1* | 12/2016 | Rey | H01F 6/06 |
| 2019/0019937 | A1* | 1/2019 | Allan | H01L 39/128 |
| 2020/0345873 | A1* | 11/2020 | Ashrafi | A61L 2/12 |
| 2021/0012929 | A1* | 1/2021 | Rey | H01L 39/24 |

FOREIGN PATENT DOCUMENTS

| | | |
|---|---|---|
| EP | 1353443 A2 | 10/2003 |
| JP | H05 258758 A | 10/1993 |
| WO | 2015092996 A1 | 6/2015 |

* cited by examiner

*Primary Examiner* — Seahvosh Nikmanesh
(74) *Attorney, Agent, or Firm* — Miller Nash LLP

(57) ABSTRACT

A structure has a substrate, and a spring structure disposed on the substrate, the spring structure having an anchor portion disposed on the substrate, an elastic material having an intrinsic stress profile that biases a region of the elastic material to curl away from the substrate, and a superconductor film in electrical contact with a portion of the elastic material. A method of manufacturing superconductor structures includes depositing a release film on a substrate, forming a stack of films comprising an elastic material and a superconductor film, releasing a portion of the elastic material by selective removal of the release film so that portion lifts out of the substrate plane to form elastic springs. A method of manufacturing superconductor structures includes depositing a release film on a substrate, forming a stack of films comprising at least an elastic material, releasing a portion of the elastic material so that portion lifts out of a plane of the substrate to form elastic springs, and coating the elastic springs with a superconductor film.

11 Claims, 3 Drawing Sheets

SUPERCONDUCTING STRESS-ENGINEERED MICRO-FABRICATED SPRINGS

TECHNICAL FIELD

This disclosure relates to electrical interconnects for computing chips, more particularly to electrical interconnects for quantum computing qubit chips.

BACKGROUND

Many types of quantum computing chips, often referred to as qubit chips as the term "qubit" means the smallest unit of information for a quantum computer, operate at cryogenic temperatures. These require superconducting interconnects. As used here the term "superconducting interconnect" means an interconnect that comprises elements with zero electrical resistance. This typically comprise superconducting materials operating at low temperature.

Using non-superconducting interconnects would generate unacceptable levels of heat. Approaches such as through-silicon-via micro-bumps work well for connecting conventional chips, but these approaches are not compatible with forming superconducting interconnects.

Another issue that arises in forming interconnects at cryogenic temperatures lies in the need for mechanical compliance. This allows for shifts in substrate dimensions due to thermal expansion mismatch. Mechanical compliance enables alignment and assembly of disparate package components at room temperatures for deployment and operation at low temperatures. State-of-the-art interconnects typically are not superconducting nor are they mechanically compliant to dimension shifts.

SUMMARY

According to aspects illustrated here, there is provided a structure having a substrate, and a spring structure disposed on the substrate, and the spring structure includes an anchor portion disposed on the substrate, an elastic material having an intrinsic stress profile that biases a region of the elastic material to curl away from the substrate, and a superconductor film in electrical contact with a portion of the elastic material.

According to aspects illustrated here, there is provided method of manufacturing superconductor structures, including depositing a release film on a substrate, forming a stack of films comprising an elastic material and a superconductor film, and releasing a portion of the elastic material by selective removal of the release film so that portion lifts out of the substrate plane to form elastic springs.

According to aspects illustrated here, there is provided a method of manufacturing superconductor structures including depositing a release film on a substrate, forming a stack of films comprising at least an elastic material, releasing a portion of the elastic material so that portion lifts out of a plane of the substrate to form elastic springs, and coating the elastic springs with a superconductor film

DETAILED DESCRIPTION OF THE EMBODIMENTS

The embodiments here show stress-engineered, superconductor micro-springs for interconnecting cryogenic circuits such as quantum computing chips. Generally, these springs form from films deposited on a substrate, where at least one film has more compressive stress nearer the substrate than the surface of the film away from the substrate. The film also has higher tensile stress on the surface of the film than nearer the substrate.

The term "spring" as used here refers to structures that curl out of the plane of the substrate. These structures are naturally mechanically compliant and can accommodate changes in package dimensions due to thermal expansion mismatch. Curling out of the plane may involve the tip of the spring curling away from the substrate, or the body of the spring curling away from the substrate as will be discussed in more detail further.

Figure 1:
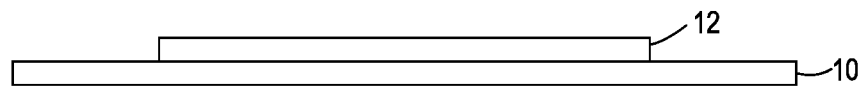
FIGS. 1-4 shows a series of film depositions to form superconducting springs.

FIG. 1 shows a substrate 10 having a release film 12 formed on it. The substrate may comprise one of many different types of materials including glass, silicon wafers, flexible substrates or laminates, such as FR 4, a glass reinforced epoxy laminate. The release film 12 may comprise any selectively removable material. It lies underneath the stress-engineered film so that when the release layer undergoes removal the film will curl out of the plane of the substrate. Metallic release films may have an advantage in that they can conduct electricity. This may allow for electroplating of any structure connected through the release layer, and possibly for electrical testing.

Figure 2:
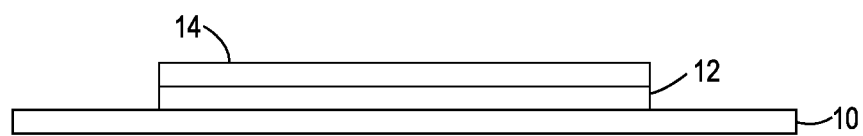

The process then forms a stack of films of a stress-engineered film and a superconducting film. FIG. 2 shows the deposition of a first film 14. The first film is deposited directly on the release layer. The first film may comprise a superconductor film, or a stress-engineered film. Both films conduct electricity, so the position of one film relative to the other is not important. While making contact through non-superconductor metals will generate heat, the superconducting metals will not generate heat, as they have no resistance at cryogenic temperatures. One should note that the stack of films may only comprise one film. In this embodiment, the superconductor film undergoes stress engineering as discussed below.

Figure 3:
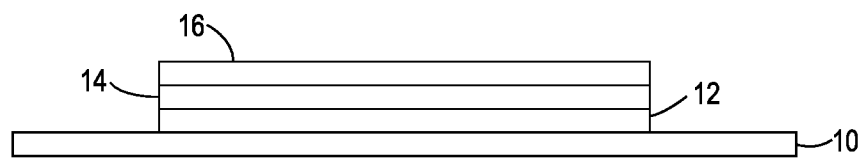

FIG. 3 shows the second of the either stress-engineered or superconductor films as 16. The superconductor film comprises a material that becomes superconducting at low temperatures. Example materials include niobium, niobium titanium (NbTi), niobium nitride (NbN), tantalum, titanium nitride (TiN), magnesium dibromide ($MgB_2$), or yttrium barium copper oxide (YBCO).

The stress-engineered film may result from many different processes. As used here, a "stress-engineered" film means a film that has a stress gradient. In the embodiments here, the stress gradient in the film results in a film having higher compressive stress near the substrate than near the surface of the film. The film stress at the substrate may be compressive, neutral, or tensile, as long as it is more compressive than some overlaying film layers above. This discussion may refer to the stress-engineered film as an elastic material.

In one embodiment, compressively-stressed films can be attained by depositing the film via physical vapor deposition (sputtering) in an ambient with relatively low pressure. The low ambient pressure leads to fewer collisions with atoms in the ambient gas and to consequently higher impact energies at the substrate, thereby leading to a more compact, compressively stressed film. The electrical power applied to the sputter target can be increased to further increase the impact energy and promote compressive stress. Tensile stress, on the other hand, can be attained by increasing the ambient pressure and decreasing the electrical power applied to the target to lower the impact energy.

As mentioned above, the stress-engineered film and the superconducting film may be the same film. However, if they are different films, the stress-engineered film may comprise a molybdenum chromium (MoCr) film, resulting from using a MoCr target during sputtering. The two films may be deposited using the same machine in one sequential sputtering process or may be deposited in separate processes in different machines. For some films, the deposition could be done using laser pulsed deposition, as is common for YBCO (yttrium barium copper oxide) superconducting films.

Figure 4:
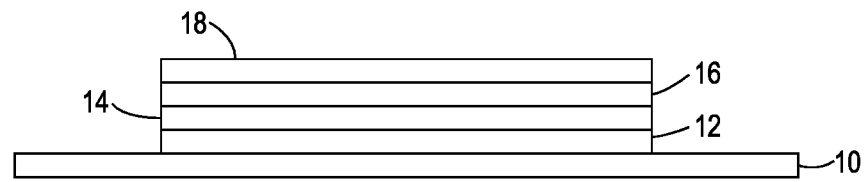

In one embodiment, a protective layer such as 18 shown in FIG. 4, may also reside in the stack of films. In summary, the stack of films 20 may comprise one film of an elastic material that is both stress-engineered and a superconductor, may include a protective film, such as gold, or at least a partial gold film that does not cover the entire film upon which it resides. The stack of films may also comprise two separate films, a superconductor film and a stress-engineered, elastic material in any order. The elastic material may reside directly on the release film, with the superconductor film directly on the stress-engineered film or the opposite. A gold film may be placed below, above, or on both sides of the stress-engineered film. In many applications, a noble metal film such as gold is desirable to protect the sandwiched films from environmental gasses or chemicals. The discussion will refer to this coating as a protective coating, whether it actually protects the underlying structure or not. The protective coating may comprise gold, nickel, copper, or combinations thereof. The discussion may refer to these films as being "arranged on" the other films, or adjacent to the other films. No order is implied by these terms and are they are meant to encompass the films being in either order.

Figure 5:
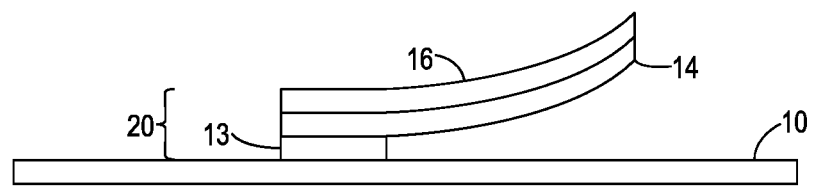
FIGS. 5 and 6 show alternative embodiments of superconducting springs.

After manufacture of the stack of films, the process selectively removes the release layer 12, leaving only anchor portions such as 13 shown in FIG. 5, to release the stack of films 20 from the substrate, however the stack is comprised. In FIG. 5, one can see that upon release, the stress gradient causes the stress-engineered film to curl up from the substrate due to the built-in stress gradient. The discussion here refers to this as the spring curling out of the plane of the substrate.

Typically, the resulting spring may be as small as 4 micrometers (µm) wide on a 6 µm pitch to 200 µm wide. The springs may have lift heights ranging from just a few microns off the substrate to nearly 1 millimeter high. The film thickness could range from 5 nanometers to several microns, depending upon the current density needed for the application. In addition, the superconducting film, if separate from the stress-engineered film, should be thin enough so it does not produce excessive mechanical load that prevents the structure from properly curling away from the substrate, while providing the needed thickness for the designed current density.

Figure 6:
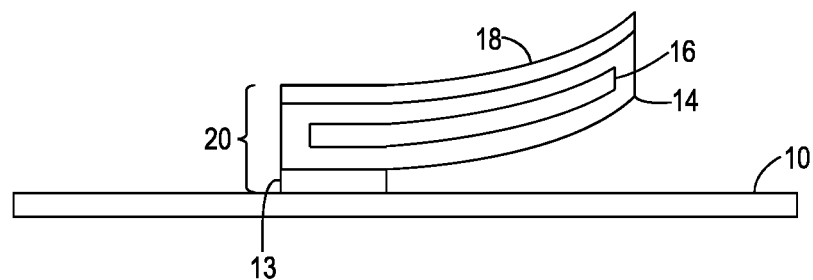

In another embodiment, the stack of films 20 could have the superconductor film deposited inside the middle of the elastic material. This may be accomplished after the first pressure part of the process but before the second pressure part of the process. The resulting structure may appear something similar to the structure shown in FIG. 6. In FIG. 6, the superconductor film, in this embodiment film 16, lies within the stress-engineered film 14. The structure of FIG. 6 includes a gold layer 18, which may or may not be included. In another embodiment, the superconductor film may envelop the elastic material, in which case the inner film would be the elastic member and the superconductor film would be the outer film. When the springs act as interconnects for quantum computing chips, the superconducting film may or may not make direct contact with the package to which they are connecting. If the superconducting layer lies on the top of the stack of film, it will make direct contact. If a protective film lies on top of the stack of films, the superconducting film may connect through the gold layer. Alternatively, the contact area may be a wide flattened region, instead of a sharp tip.

Figure 7:
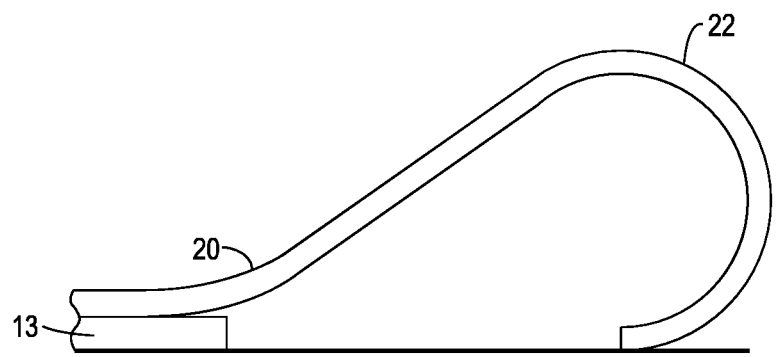
FIG. 7 shows an embodiment of a released thin film structure utilizing backside metal areas to form contacts.

FIG. 7 shows a released thin film structure that utilizes broad backside metal areas such as 22 to form contacts. These broad backside contact areas such as 22 can be attained for example, by letting the spring tip curl around their radius of curvature so the backside of the spring is at the highest point that contacts a pad. The spring shape can be manipulated by adding straight segments with large radius of curvatures or segments with reversed curvature that bends the spring in the opposite direction. These segments can be formed by adding mechanical load layers or by depositing films of the opposite stress gradient on those areas.

Figure 8:
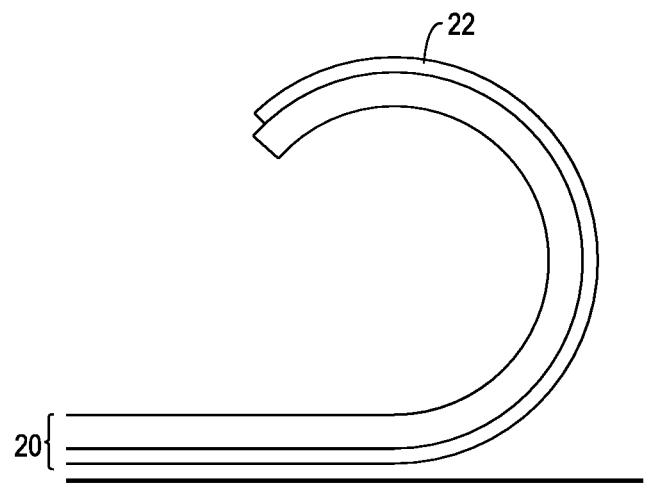
FIG. 8 shows an embodiment of a stack of films that curl out of the plane of the substrate past 90 degrees.

FIG. 8 shows an embodiment of a stack of films 20 that curl out of the plane of the substrate past 90 degrees to provide the backside metal areas such as 22.

The result has a substrate with a spring. The spring structure has an anchor portion disposed on the substrate. The spring structure has an elastic material having an intrinsic stress profile that biases a region of the elastic material to curl away from the substrate, and a superconductor film in electrical contact with a portion of the elastic material. The region may be the tip of the spring or a region of the elastic material between the anchor portion and the tip, such as that shown in FIGS. 7 and 8.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A structure comprising:
  a substrate; and
  a spring structure disposed on the substrate, the spring structure comprising:
    an anchor portion disposed on the substrate;
    an elastic material having an intrinsic stress profile that biases a region of the elastic material to curl away from the substrate; and
    a superconductor film in electrical contact with a portion of the elastic material.

2. The structure as claimed in claim 1, wherein the elastic material comprises molybdenum chromium alloy.

3. The structure as claimed in claim 1, wherein the superconductor film comprises one of the group consisting of: niobium, niobium titanium, niobium nitride, tantalum, titanium nitride, yttrium barium copper oxide, or magnesium diboride.

4. The structure as claimed in claim 1, wherein the superconductor film lies above the elastic material.

5. The structure as claimed in claim 1, wherein the superconductor film lies below the elastic material.

6. The structure as claimed in claim 1, wherein the superconductor film lies within the elastic material.

7. The structure as claimed in claim 1, wherein the superconductor film envelopes the elastic material.

8. The structure as claimed in claim 1, wherein the superconductor film and the elastic material are the same film.

9. The structure as claimed in claim 1, further comprising a coating on the spring structure.

10. The structure as claimed in claim 9, wherein the coating comprises at least one of copper, nickel, or gold, or combinations thereof.

11. The structure as claimed in claim 1, wherein the superconductor film has a thickness sufficient to achieve a desired current density but thin enough to allow the elastic material to curl out of a plane of the substrate when released.

* * * * *